(12) United States Patent
Fukuoka et al.

(10) Patent No.: US 6,479,615 B2
(45) Date of Patent: Nov. 12, 2002

(54) POLYAMIC ACID, POLYIMIDE RESIN OBTAINED THEREFROM AND APPLICATION THEREOF TO CIRCUIT BOARD

(75) Inventors: Takahiro Fukuoka, Osaka (JP); Amane Mochizuki, Osaka (JP); Naoki Kurata, Osaka (JP); Naotaka Kinjo, Osaka (JP); Toshihiko Omote, Osaka (JP)

(73) Assignee: Nitto Denko Corporation, Osaka (JP)

( * ) Notice: Subject to any disclaimer, the term of this patent is extended or adjusted under 35 U.S.C. 154(b) by 44 days.

(21) Appl. No.: 09/732,711

(22) Filed: Dec. 11, 2000

(65) Prior Publication Data

US 2001/0051707 A1 Dec. 13, 2001

(30) Foreign Application Priority Data

| Dec. 10, 1999 | (JP) | 11-352325 |
| Dec. 10, 1999 | (JP) | 11-352326 |
| Dec. 10, 1999 | (JP) | 11-352327 |
| Dec. 10, 1999 | (JP) | 11-352328 |
| May 6, 2000 | (JP) | 2000-171993 |
| May 16, 2000 | (JP) | 2000-148613 |
| May 16, 2000 | (JP) | 2000-148614 |
| Sep. 4, 2000 | (JP) | 2000-267636 |

(51) Int. Cl.[7] ................ C08G 73/10; C08G 69/26; B32B 24/00

(52) U.S. Cl. ............ 528/170; 528/125; 528/128; 528/172; 528/173; 528/174; 528/176; 528/179; 528/183; 528/185; 528/188; 528/220; 528/229; 528/350; 528/353; 428/458; 428/209; 428/411.1; 428/457; 428/901

(58) Field of Search ................ 528/170, 125, 528/353, 128, 192, 193, 199, 174, 176, 183, 185, 188, 220, 229, 350; 428/215, 458, 411, 457, 901

(56) References Cited

U.S. PATENT DOCUMENTS

| 5,108,201 A | * | 4/1992 | Matsuura et al. | 385/143 |
| 5,276,133 A | * | 1/1994 | Okawa et al. | 528/353 |
| 5,723,206 A | * | 3/1998 | Higashi et al. | 428/473.5 |
| 5,858,518 A | * | 1/1999 | Omote et al. | 428/209 |
| 6,232,428 B1 | * | 5/2001 | Deets et al. | 528/170 |

* cited by examiner

Primary Examiner—P. Hampion-Hightower
(74) Attorney, Agent, or Firm—Sughrue Mion, PLLC

(57) ABSTRACT

The polyamic acid of the invention can be obtained by the reaction of an acid anhydride component comprising pyromellitic anhydride and 2,2-bis(3,4-dicarboxyphenyl)hexafluoropropane with 2,2'-di-substituted-4,4'-diaminobiphenyls as a first aromatic diamine and any aromatic diamine component, as a second aromatic diamine, of 2,2-bis(4-aminophenoxyphenyl)propanes, 1,1-bis(4-(4-aminophenoxy)-3-t-butyl-6-methylphenyl)butane, 2,2-bis(3-amino-4-methylphenyl)hexafluoropropane and α,α'-bis(4-aminophenyl)diisopropylbenzenes in an organic solvent. The polyimide resin of the invention can be obtained by heating such a polyamic acid solution. In the production of a circuit board, by using a photosensitive polyamic acid having a sensitizer incorporated in such a polyamic acid solution, a patterned polyimide resin layer can be provided as an insulation layer on a metal foil.

5 Claims, 6 Drawing Sheets

POLYAMIC ACID, POLYIMIDE RESIN OBTAINED THEREFROM AND APPLICATION THEREOF TO CIRCUIT BOARD

BACKGROUND OF THE INVENTION

1. Field of the Invention

The present invention relates to a polyimide resin, a polyamic acid which gives such a polyimide resin, a circuit board comprising a polyimide resin, and a wireless suspension board. More particularly, the present invention relates to a novel polyimide resin having a low linear/expansion coefficient and a low dielectric constant which can be used as various protective layers or interlayer insulation layers in semiconductor, oriented layers in liquid crystal element, base films in flexible printed-wiring board, gas-permeable membranes, heat-resistant adhesives, etc., and a polyamic acid which gives such a polyimide resin.

The present invention further relates to a circuit board comprising an insulation layer comprising a polyimide resin provided on a metal foil substrate and a wireless suspension board comprising a pattern circuit comprising a conductor layer provided on such a circuit board.

In order that a magnetic disc device such as hard disc device used as an external memory device for computer, etc. performs magnetic recording or reproduction, it is necessary that the magnetic disc and the magnetic head be allowed to run relative to each other to produce an air stream against which the magnetic disc is elastically pressed onto the magnetic disc so that a predetermined minute clearance is kept therebetween. The magnetic head supporting device for elastically pressing the magnetic head onto the magnetic disc against the air stream is a suspension. The present invention relates to a circuit board which can be preferably used to produce such a wireless suspension board and a suspension board with patterned circuit comprising a circuit comprising a conductor layer formed on such a circuit board by patterning technique.

2. Description of the Related Art

A polyimide resin makes the use of its excellent mechanical strength or electrical insulation in addition to its high heat resistance to find wide application in electrical and electronic fields. However, polyimide resins which have heretofore been known normally have a poor solubility in an organic solvent. Accordingly, in order to obtain a polyimide resin film for example, a polyamic acid which is a precursor thereof is dissolved in an organic polar solvent to give a solution which is casted, and then heated to a temperature as high as 300° C. or higher so that it is subjected to ring closure and imidation.

In the recent years, on the other hand, a polyimide resin having a small dielectric constant has been required to realize faster processing of signal. To this end, various polyimide fluoride resins having fluorine atom incorporated in molecules have been developed. However, such a polyimide fluoride resin which has heretofore been known normally has a high linear thermal expansion coefficient. As described in T. Matsushita et al., "Macromolecules", 26, 419, 1993, a polyimide fluoride resin obtained by the reaction of 2,2'-di(trifluoromethyl)-4,4'-diaminobiphenyl with 2,2-bis(3,4-dicarboxyphenyl) hexafluoropropane has a dielectric constant as low as 2.8 but has a linear thermal expansion coefficient as high as 45 ppm.

Referring particularly to circuit board, as a thin multilayer circuit board for the purpose of enhancing the packaging density of semiconductor or the speed of processing of signal there has recently been used a circuit board comprising an insulation layer comprising a polyimide resin provided on a metal foil. However, since the polyimide resin which has heretofore been normally used as an insulating material has a greater linear thermal expansion coefficient than various metal foils, the resulting circuit board is liable to warping thereof or cracking or peeling of the resin layer.

In order to solve these problems, 2,2'-di(trifluoromethyl)-4,4'-diaminobiphenyl and pyromellitic anhydride are reacted to obtain a polyimide fluoride resin having a linear thermal expansion coefficient as low as 0 ppm. However, this polyimide fluoride resin has a dielectric constant as high as 3.2.

Further, computers and memories as its peripheral equipment have been required to have a greater capacity as well as a smaller size or lower cost. Under these demands, technology for hard disc drive has shown a remarkable progress among many technologies. Referring to magnetic head, it has been of urgent necessity to develop thin layer magnetic head (TFH) comprising a coil portion having a reduced thickness or even thin layer-magnetic resistor composite head (MR) which can both read and write and has a drastically great memory capacity instead of the metal-in-gap (MIG) type head of the related art.

However, depending on the technique of the related art which comprises drawing a conductor line on a suspension board to form a desired wiring, the conductor line can have an effect on the elastic modulus of the suspension, causing the change of the floated amount of magnetic head. In some cases, the magnetic head can come in contact with the magnetic disc, deteriorating the durability of the magnetic disc device.

Under these circumstances, a suspension comprising an electrical circuit formed directly on a suspension board having a head mounted thereon has recently been put to practical use. As previously mentioned, however, a suspension which is eventually obtained comprising the circuit board of the related art comprising a polyimide resin as an insulation layer, too, can be subject to defective insulation or warping leading to defective properties because the polyimide resin exhibits a greater linear thermal expansion coefficient than metal foil substrate.

SUMMARY OF THE INVENTION

The present invention has been worked out to solve the foregoing problems with the polyimide resin of the related art as a first aspect.

An object of the present invention is to provide a novel polyimide resin having a low linear thermal expansion coefficient and a low dielectric constant in addition to excellent characteristics inherently possessed by a polyimide resin and a polyamic acid which gives such a polyimide resin.

The present invention has also been worked out to solve the foregoing problems with the circuit board of the related art comprising an insulation layer comprising a polyimide resin provided on a metal foil and wireless suspension board comprising such a circuit board as a second aspect.

Another object of the present invention is to provide a circuit board which comprises an insulation layer comprising a polyimide resin having a low linear thermal expansion coefficient close to that of various metal foils and a low dielectric constant provided on a metal foil and thus is not liable to cracking or peeling of the resin layer as well as warping of the resin layer.

A further object of the present invention is to provide a wireless suspension board comprising such a circuit board.

The present invention provides a polyamic acid having a weight-average molecular weight of from 20,000 to 100,000 comprising a repeating unit represented by the following formula (I):

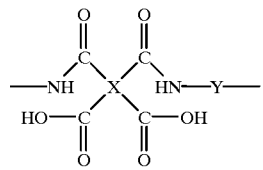
(I)

wherein X represents a tetravalent organic group represented by the following formula (a):

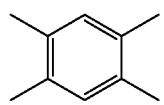
(a)

or the following formula (b):

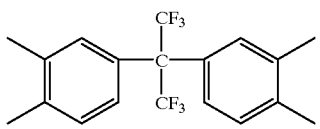
(b)

and Y represents a divalent organic group represented by the following formula (c):

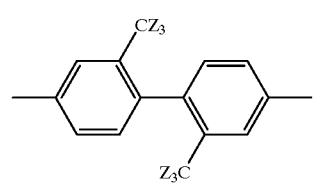
(c)

(in which Z represents a hydrogen atom or a fluorine atom), the following formula (d):

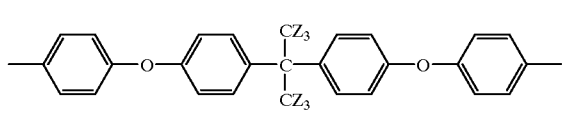
(d)

(in which Z represents a hydrogen atom or a fluorine atom), the following formula (e):

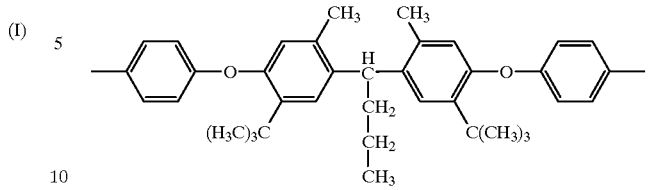
(e)

the following formula (f):

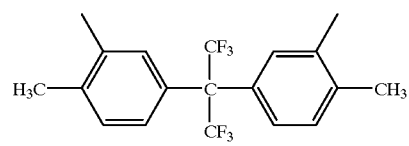
(f)

or the following formula (g):

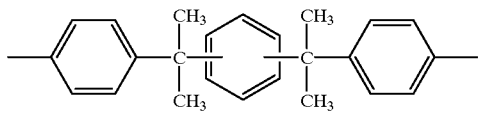
(g)

wherein the organic group represented by the formula (a) and the organic group represented by the formula (b) account for from 20 to 99 mol % and from 1 to 80 mol % of the organic groups represented by X, respectively, and the organic group represented by the formula (C) and the organic group represented by the formula (d), (e), (f) or (g) account for from 20 to 99 mol % and from 1 to 80 mol % of the organic groups represented by Y, respectively.

The present invention also provides a polyimide resin having a weight-average molecular weight of from 20,000 to 100,000 comprising a repeating unit represented by the following formula (II):

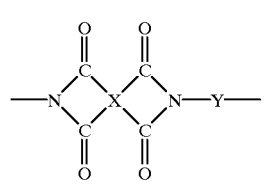
(II)

wherein X represents a tetravalent organic group represented by the following formula (a):

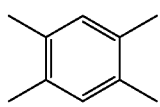
(a)

or the following formula (b):

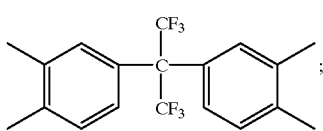

(b)

and Y represents a divalent organic group represented by the following formula (c):

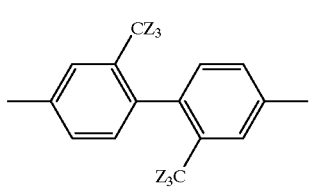

(c)

(in which Z represents a hydrogen atom or a fluorine atom), the following formula (d):

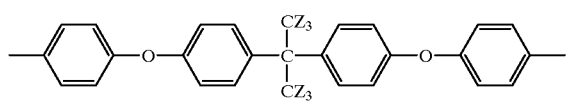

(d)

(in which Z represents a hydrogen atom or a fluorine atom), the following formula (e):

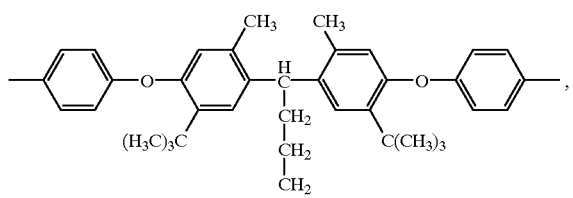

(e)

the following formula (f):

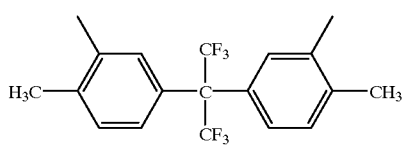

(f)

or the following formula (g):

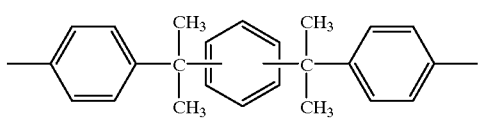

(g)

wherein the organic group represented by the formula (a) and the organic group represented by the formula (b) account for from 20 to 99 mol % and from 1 to 80 mol % of the organic groups represented by X, respectively, and the organic group represented by the formula (C) and the organic group represented by the formula (d), (e), (f) or (g) account for from 20 to 99 mol % and from 1 to 80 mol % of the organic groups represented by Y, respectively.

The present invention further provides a circuit board comprising an insulation layer comprising a polyimide resin provided on a metal foil substrate.

The present invention further provides a wireless suspension board comprising an insulation layer comprising a polyimide resin provided on a metal foil substrate and a pattern circuit comprising a conductor layer provided thereon.

BRIEF DESCRIPTION OF THE DRAWINGS

[Brief Description of the Drawings]

Figure 1:
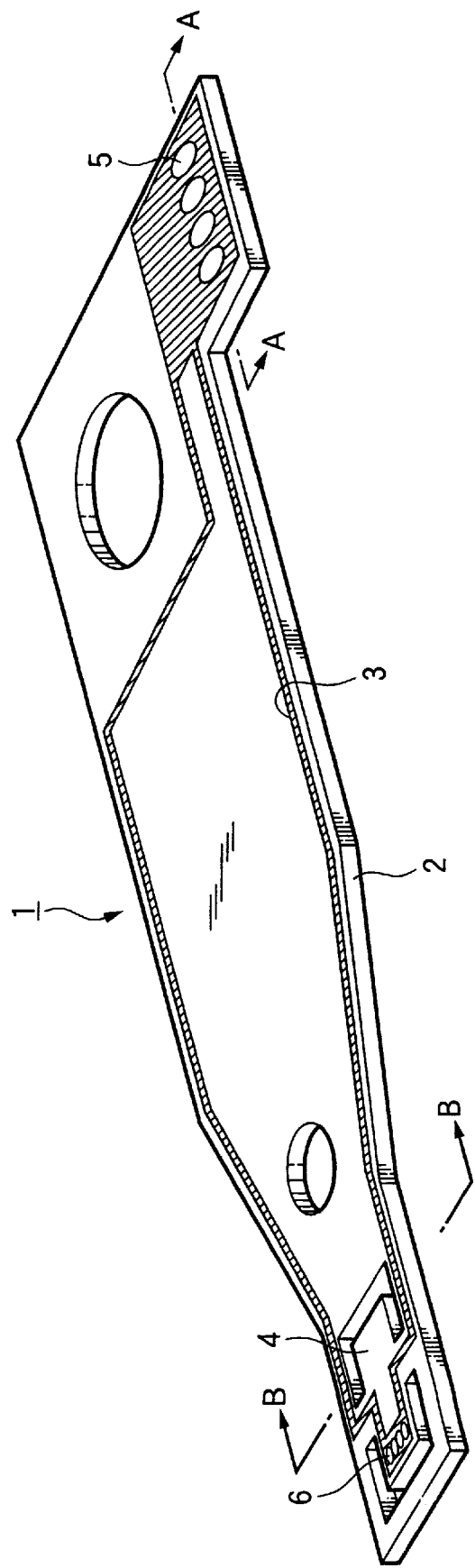

FIG. 1 is a perspective view illustrating an embodiment of the wireless suspension board 1 according to the invention.

Figure 2:
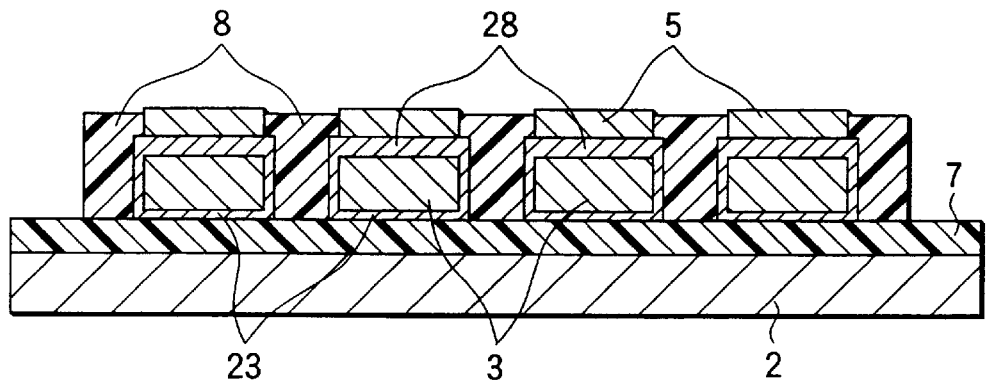

FIG. 2 is a section view taken on the line A—A of FIG. 1.

Figure 3:
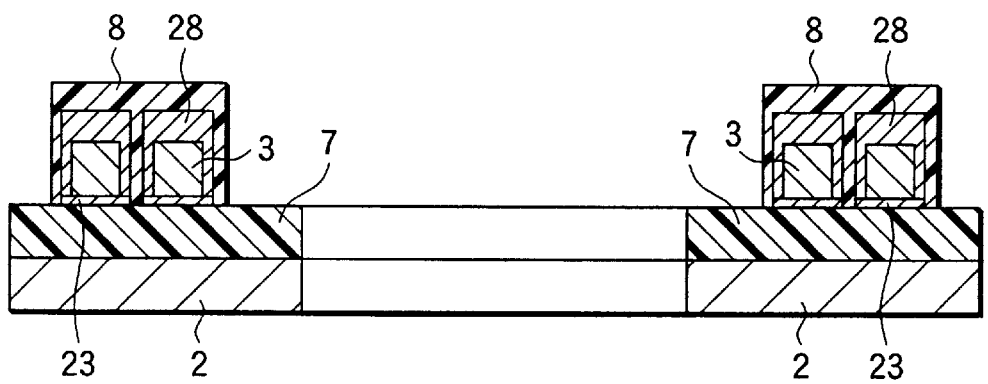

FIG. 3 is a section view taken on the line B—B of FIG. 1.

FIGS. 4 to 16 each is a partial section view of essential part illustrating a process for the production of a wireless suspension board according to the invention.

The reference numerals and signs in FIGS. 1 to 16 are as follows.

1 Wireless suspension board
2 Stainless steel foil substrate
3 conductor layer
4 gimbal
5, 6 Terminal
7 Insulation layer
8 Coat layer
21 Coat layer comprising photosensitive polyamic acid
22 Insulation layer comprising polyimide resin
23 Thin chromium layer
24 Thin copper layer
25 Conductor layer
26 Photoresist
27 Conductor pattern
28 Thin nickel layer
29 Polyimide resin
30 Lead portion
31 Polyimide resin coat layer
33 Electrolytically deposited thin gold layer
34 Terminal
35 Photoresist

DETAILED DESCRIPTION OF THE INVENTION

A polyamic acid according to the present invention and a polyimide resin obtained therefrom will be described hereinafter as a first aspect of the present invention.

The polyamic acid according to the invention comprises a repeating unit represented by the foregoing formula (I). The organic group represented by the formula (a) and the organic group represented by the formula (b) account for from 20 to 99 mol % and from 1 to 80 mol % of the organic groups represented by X, respectively, and the organic group represented by the formula (C) and the organic group represented by the formula (d), (e), (f) or (g) account for from 20 to 99 mol % and from 1 to 80 mol % of the organic groups represented by Y, respectively. The polyamic acid according to the invention has a weight-average molecular weight of from 20,000 to 100,000.

Such a polyamic acid can be obtained by the reaction of (i) an acid anhydride component comprising pyromellitic anhydride (a'):

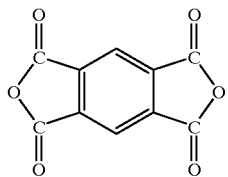

and 2,2-bis(3,4-dicarboxyphenyl)hexafluoropropane (b'):

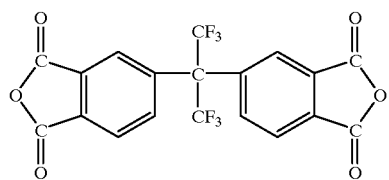

(ii) 2,2'-di-substituted-4,4'-diaminobiphenyl, as a first aromatic diamine, represented by the following formula (c'):

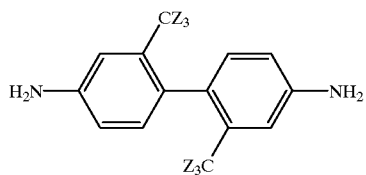

(wherein Z represents a hydrogen atom or a fluorine atom), and (iii) any aromatic diamine component, as a second aromatic diamine, selected from the group consisting of 2,2-bis(4-aminophenoxyphenyl)propanes represented by the following formula (d'):

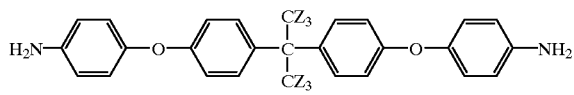

(wherein Z represents a hydrogen atom or a fluorine atom), 1,1-bis(4-(4-aminophenoxy)-3-t-butyl-6-methylphenyl) butane represented by the following formula (e'):

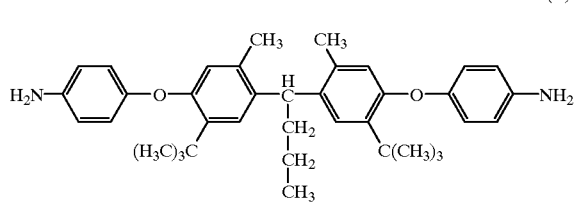

2,2-bis(3-amino-4-methylphenyl)hexafluoropropane represented by the following formula (f'):

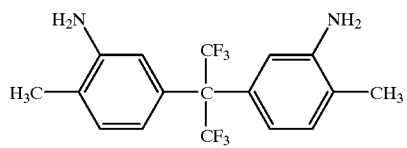

and α,α'-bis(4-aminophenyl)diisopropylbenzenes represented by the following formula (g'):

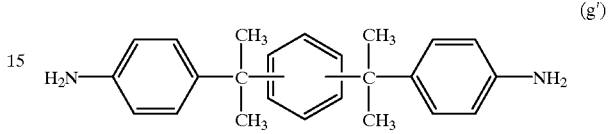

in an organic solvent.

Specific examples of 2,2'-di-substituted-4,4'-diaminobiphenyl, as a first aromatic diamine, represented by the foregoing formula (c') include 2,2'-dimethyl-4,4'-diaminobiphenyl, and 2,2'-di(trifluoromethy)-4,4'-diaminobiphenyl.

Specific examples of 2,2-bis(4-aminophenoxyphenyl) propanes represented by the foregoing formula (d') among the foregoing second aromatic diamines include 2,2-bis(4-aminophenoxyphenyl)propane, and 2,2-bis(4-aminophenoxy diphenyl)hexafluoropropane. Specific examples of α,α'-bis(4-aminophenyl)diisopropylbenzenes represented by the foregoing formula (g') include α,α'-bis(4-aminophenyl)-1,4-diisopropylbenzene, and α,α'-bis(4-aminophenyl)-1,3-diisopropylbenzene.

In the production of the foregoing polyamic acid according to the invention, the proportion of pyromellitic anhydride and 2,2-bis(3,4-dicarboxyphenyl)hexafluoropropane in the foregoing acid anhydride component are from 20 to 99 mol % and from 1 to 80 mol %, preferably from 60 to 95 mol % and from 5 to 40 mol %, respectively.

The proportion of the first aromatic diamine (i.e., 2,2'-di-substituted-4,4'-diaminobiphenyls represented by the foregoing formula (c')) in the foregoing aromatic diamine component is from 20 to 99 mol %, preferably from 60 to 95 mol %. On the other hand, the proportion of the second aromatic diamine (i.e., any aromatic diamine selected from the group consisting of 2,2-bis(4-aminophenoxyphenyl) propane represented by the foregoing formula (d'), 1,1-bis(4-(4-aminophenoxy)-3-t-butyl-6-methylphenyl)butane represented by the foregoing formula (e'), 2,2-bis(3-amino-4-methylphenyl)hexafluoropropane represented by the foregoing formula (f') and α,α'-bis(4-aminophenyl) diisopropylbenzenes represented by the following formula (g')) in the foregoing aromatic diamine component is from 1 to 80 mol %, preferably from 5 to 40 mol %.

Supposing that the number of moles of pyromellitic anhydride and 2,2-bis(3,4-dicarboxyphenyl) hexafluoropropane are and b, respectively, the proportion (mol %) of pyromellitic acid and 2,2-bis(3,4-dicarboxyphenyl) hexafluoropropane are defined by the equation (a/(a+b))×100 and (b/(a+b))×100, respectively.

Similarly, supposing that the number of moles of the foregoing first aromatic diamine and the foregoing second aromatic diamine are c and d, respectively, the proportion (mol %) of the foregoing first aromatic diamine and the foregoing second aromatic diamine are (c/(c+d))×100 and (d/(c+d))×100, respectively.

As the solvent to be used in the reaction of the acid anhydride with the aromatic diamine component there may be used any solvent which can dissolve the acid anhydride component and aromatic diamine component as well as the resulting polyamic acid therein. Preferred examples of the solvent employable herein include N-methyl-2-pyrrolidone, N,N-dimethylacetamide, N,N-diethylacetamide, dimethyl sulfoxide, tetrahydrofuran, 1,4-dioxane, hexamethylphosphoramide, and N-methyl-ε-caprolactam. These solvents may be used singly or in admixture.

In the foregoing reaction of the acid anhydride with the aromatic diamine component, the concentration of the total amount of the acid anhydride component and the aromatic diamine component in the organic solvent is not specifically limited. In practice, however, it is from 1 to 50% by weight, preferably from 5 to 30% by weight.

In accordance with the present invention, the polyamic acid represented by the foregoing formula (I) can be obtained by the reaction of the foregoing acid anhydride with the foregoing aromatic diamine component in the foregoing organic solvent at a temperature of 250° C. or lower, preferably from room temperature (25° C.) to 80° C. The reaction time depends on the acid anhydride component and aromatic diamine component used, their mixing proportion, the organic solvent used, the reaction temperature, etc. In practice, however, it is from 2 hours to 48 hours.

In accordance with the present invention, a solution of a polyamic acid in the organic solvent which stays in the state of solution at room temperature can be obtained in the foregoing manner. By adding this solution to a poor solvent which doesn't dissolve the polyamic acid therein, the polyamic acid can be precipitated. Thus, the polyamic acid can be then obtained in powder form. The polyamic acid thus obtained in powder form can be dissolved in an organic solvent as mentioned above.

The polyamic acid thus obtained normally has a number-average molecular weight of from 10,000 to 50,000 and a weight-average molecular weight of from 20,000 to 100,000.

In accordance with the present invention, the foregoing polyamic acid solution can be casted onto a proper substrate, and then heated to a temperature of from 300° C. to 400° C. in a proper atmosphere for several hours so that the polyamic acid is subjected to ring closure and hence imidization to obtain a polyimide resin film. If necessary, the foregoing heating may be preceded by preheating to a temperature of from about 30° C. to 300° C. This preheating may be effected at a constant rate or stepwise to about 300° C. The atmosphere in which heating is effected is not specifically limited but may be any of air, inert gas such as nitrogen and vacuum.

The polyimide resin thus obtained normally has a number-average molecular weight of from 10,000 to 50,000 and a weight-average molecular weight of from 20,000 to 100,000 similarly to polyamic acid as precursor of polyimide resin.

In accordance with the present invention, the polyimide resin thus obtained has a low linear thermal expansion coefficient and a low dielectric constant. In general, the linear thermal expansion coefficient and dielectric constant of the polyimide resin of the invention are from 5 to 30 ppm and from 2.8 to 3.2, respectively. The resulting polyimide resin can be preferably used as various protective layers or interlayer insulation layers in semiconductor, oriented layers in liquid crystal element, base films in flexible printed-wiring board, gas-permeable membranes, heat-resistant adhesives, etc. In particular, the polyimide resin according to the invention can be preferably used in the preparation of various electronic parts for the realization of faster electrical transmission of signal in computer, etc., particularly as an insulation layer for wireless suspension board.

As a second aspect of the present invention, a circuit board comprising an insulation layer comprising the foregoing polyimide resin provided on a metal foil substrate and a wireless suspension board comprising a pattern circuit comprising a conductor layer provided on such a circuit board will be described hereinafter.

The circuit board according to the invention comprises an insulation layer comprising the foregoing polyimide resin provided on a metal foil substrate.

In other words, the circuit board according to the invention comprises an insulation layer comprising a polyimide resin provided on a metal foil substrate, wherein the polyimide resin comprises a repeating unit represented by the following formula (II):

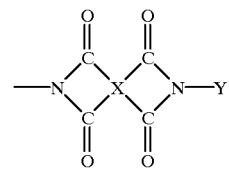

wherein X represents a tetravalent organic group represented by the following formula (a):

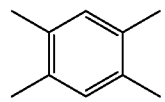

or the following formula (b):

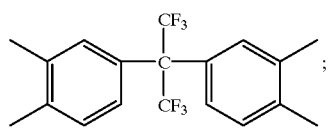

and Y represents a divalent organic group represented by the following formula (c):

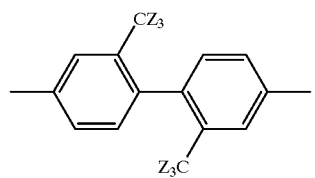

(in which Z represents a hydrogen atom or a fluorine atom), the following formula (d):

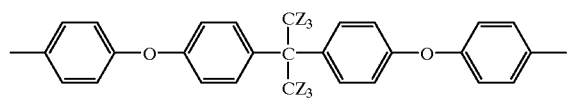

(in which Z represents a hydrogen atom or a fluorine atom), the following formula (e):

(e)

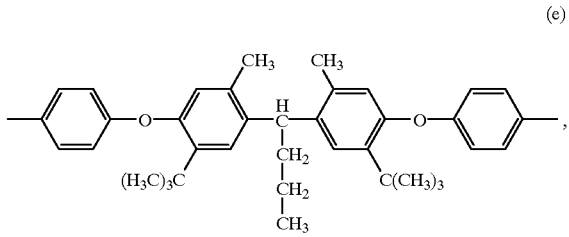

the following formula (f):

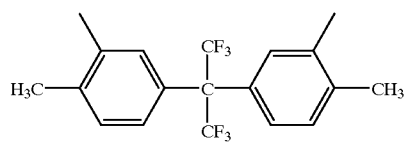
(f)

or the following formula (g):

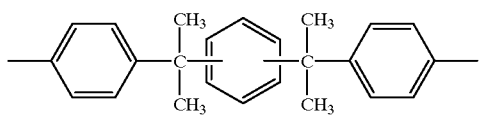
(g)

wherein the organic group represented by the formula (a) and the organic group represented by the formula (b) account for from 20 to 99 mol % and from 1 to 80 mol % of the organic groups represented by X, respectively, and the organic group represented by the formula (C) and the organic group represented by the formula (d), (e), (f) or (g) account for from 20 to 99 mol % and from 1 to 80 mol % of the organic groups represented by Y, respectively, and has a weight-average molecular weight of from 20,000 to 100,000.

As mentioned above, the foregoing polyimide resin can be obtained by the reaction of an acid anhydride component comprising pyromellitic anhydride and 2,2-bis(3,4-dicarboxyphenyl)hexafluoropropane dihydrate with an aromatic diamine component comprising 2,2'-di-substituted-4,4'-diaminobiphenyls, as a first aromatic diamine, represented by the foregoing formula (c') and any aromatic diamine, as a second aromatic diamine, selected from the group consisting of 1,1-bis(4-(4-aminophenoxy)-3-t-butyl-6-methylphenyl) butane represented by the foregoing formula (e'), 2,2-bis(3-amino-4-methylphenyl) hexafluoropropane represented by the following formula (f') and α,α'-bis(4-aminophenyl)diisopropylbenzenes represented by the following formula (g').

Similarly, the wireless suspension board of the invention comprises an insulation layer comprising a polyimide resin provided on a metal foil substrate and a pattern circuit comprising a conductor layer provided on the insulation layer, characterized in that the polyimide resin comprises a repeating unit represented by the foregoing formula (II).

In some detail, the foregoing polyimide resin to be used in the circuit board and wireless suspension board according to the invention can be obtained by irradiating a polyamic acid obtained by the reaction of an acid anhydride component comprising pyromellitic anhydride and 2,2-bis(3,4-dicarboxyphenyl)hexafluoropropane dihydrate with 2,2'-di-substituted-4,4'-diaminobiphenyls, as a first aromatic diamine, represented by the foregoing formula (c') and any aromatic diamine, as a second aromatic diamine, selected from the group consisting of 1,1-bis(4-(4-aminophenoxy)-3-t-butyl-6-methylphenyl) butane represented by the foregoing formula (e'), 2,2-bis(3-amino-4-methylphenyl) hexafluoropropane represented by the following formula (f') and α,α'-bis(4-aminophenyl)diisopropylbenzenes represented by the following formula (g'), i.e., polyimide resin precursor with ultraviolet rays in the presence of a sensitizer, followed by heating.

As mentioned above, the foregoing polyamic acid can be obtained by the reaction of the foregoing acid anhydride component with the foregoing aromatic diamine component in an organic solvent. The proportion of the foregoing acid anhydride component and aromatic diamine component, the organic solvent to be used in the reaction, the reaction temperature, the reaction time, etc. are as described above. Accordingly, the resulting polyamic acid normally has a number-average molecular weight of from 10,000 to 50,000 and a weight-average molecular weight of from 20,000 to 100,000 as mentioned above.

In accordance with the present invention, a polyamic acid solution is obtained from an aromatic diamine component and an acid anhydride component. The polyamic acid solution is then mixed with a sensitizer to give a photosensitive polyamic acid solution. The photosensitive polyamic acid solution is irradiated with ultraviolet rays, and then heated to obtain a polyimide resin having a low linear thermal expansion coefficient and a low dielectric constant. The polyimide resin thus obtained normally has a linear expansion coefficient of from 5 to 30 ppm and a dielectric constant of from 2.8 to 3.2.

The metal foil substrate to be used in the circuit board of the invention is not specifically limited. In practice, however, a stainless steel foil, copper foil, aluminum foil, copper-beryllium foil, phosphor bronze foil, 42 alloy foil, etc. may be used. In accordance with the present invention, such a metal foil substrate is preferably of continuous length. In some detail, an insulation layer comprising a polyimide resin is provided on a metal foil substrate of continuous length in such an arrangement that a repetition of a certain pattern is formed. A desired pattern circuit comprising a conductor layer is formed on each of these patterned insulation layers. Eventually, the metal foil substrate is cut every individual pattern circuit to obtain an individual wireless suspension board.

In accordance with the present invention, the circuit board can be obtained preferably by applying the foregoing photosensitive polyamic acid solution to a metal foil substrate of continuous length, normally a stainless steel foil of continuous length, drying the coated material to form a film, exposing the film to ultraviolet rays through a mask having a predetermined pattern, heating the material thus exposed (heating after exposure), developing the material, and then subjecting the material to heat curing (polyimidization of polyamic acid) to form a predetermined pattern comprising polyimide resin as an insulation layer.

The foregoing photosensitive polyamic acid solution is a liquid composition obtained by the reaction of an aromatic diamine component with an acid anhydride component at a substantially equimolecular ratio in the foregoing organic solvent to produce a polyamic acid, and then blending the polyamic acid with a sensitizer as previously mentioned.

In the present invention, as the foregoing sensitizer there may be used a dihydropyridine derivative represented by the following formula (III):

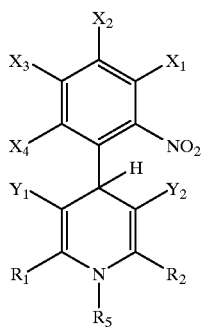

(III)

wherein $X_1$ to $X_4$ each independently represent a hydrogen atom, fluorine atom, nitro group, methoxy group, amino group, dialkylamino group, cyano group or fluorinated alkyl group; $Y_1$ represents a cyano group or formula —$COR_3$; $Y_2$ represents a cyano group or formula —$COR_4$ (in which $R_3$ and $R_4$ each independently represent a $C_{1-4}$ alkyl group or alkoxy, amino, toluidino, benzyloxy, amino or dialkylamino group); and $R_1$, $R_2$ and $R_5$ each independently represent a hydrogen atom or $C_{1-3}$ alkyl group, with the proviso that $R_1$ and $R_3$, and $R_2$ and $R_4$ may together form a 5-membered, 6-membered or heterocyclic ring containing keto group, as described in detail in JP-A-6-75376.

Specific examples of the sensitizer employable herein include 4-o-nitrophenyl-3,5-dimethoxycarbonyl-2,6-dimethyl-1,4-dihydropyridine (hereinafter referred to as "nifedipine"), 4-o-nitrophenyl-3,5-dimethoxycarbonyl-2,6-dimethyl-1-methyl-4-hydropyridine (hereinafter referred to as "N-methyl form"), and 4-o-nitrophenyl-3,5-diacetyl-1,4-dihydropyridine (hereinafter simply referred to as "acetyl form"). These sensitizers may be used singly or in admixture. If necessary, imidazole may be used as a dissolving aid for developer in a proper amount.

In the present invention, the foregoing dihydropyridine derivative is normally used in an amount of from 0.05 to 0.5 mols per mol of the sum of the amount of the foregoing aromatic diamine component and acid anhydride component. Similarly, imidazole is normally used in an amount of from 0.05 to 0.5 mols per mol of the sum of the amount of diamine component (The term "diamine component" will be described later) containing aromatic diamine component and acid anhydride component as necessary.

In accordance with the present invention, the foregoing photosensitive polyamic acid solution is applied to a proper substrate, dried, irradiated with ultraviolet rays (irradiation with ultraviolet rays), and then heated (heating after exposure) to form a positive or negative latent image which is in turn developed to obtain a positive or negative image, i.e., desired pattern. The pattern is eventually heated to a high temperature so that the polyamic acid is imidized to obtain a patterned film comprising polyimide resin.

In some detail, the foregoing photosensitive polyamic acid, though somewhat depending on the kind of the sensitizer used, is dissolved in the developer at the exposed area if the temperature of heating after exposure is as relatively low as around 140° C. to form a positive image or is dissolved in the developer at the unexposed area if the temperature of heating after exposure is as relatively high as about 140° C. or higher to form a negative image.

As the foregoing developer there may be normally used an aqueous solution of an organic alkali such as tetramethylammonium hydroxide or an aqueous solution of an inorganic alkali such as sodium hydroxide and potassium hydroxide. The concentration of alkali is preferably from 2% to 5% by weight in general. If necessary, the foregoing aqueous solution of alkali may comprise a lower aliphatic alcohol such as methanol, ethanol, n-propanol and isopropanol incorporated therein. The amount of such an alcohol to be incorporated is normally 50% by weight or less. The development temperature is preferably from 25° C. to 50° C. in general.

The foregoing photosensitive polyamic acid to be used in the invention undergoes at the unexposed area the formation of hydrogen bond between hydrogen in the imino group at 1-position in the foregoing dihydropyridine derivative and the carboxyl group in the polyamic acid that lowers the hydrophilicity of polyimide resin and the speed of diffusion of the developer into the film, resulting in the reduction of the speed of dissolution of the film in the developer if the temperature of heating after exposure is as relatively low as around 140° C. On the other hand, the foregoing photosensitive polyamic acid undergoes during exposure at the exposed area the conversion of the foregoing dihydropyridine derivative as a neutral compound to a basic pyridine compound that forms a weak salt structure with a polyamic acid, resulting in the increase of the hydrophilicity of the film and hence the speed of dissolution of the film in the developer. Thus, since the speed of dissolution of the film in the developer is greater at the exposed area than at the unexposed area, the film which has been subjected to exposure, heating after exposure and development gives a positive image.

On the other hand, the photosensitive polyamic acid to be used in the invention undergoes at the unexposed area the reduction of the speed of dissolution of the film in the developer as in the case where the temperature of heating after exposure is as relatively low as around 140° C. if the temperature of heating after exposure is as relatively high as about 170° C. or higher. On the contrary, the photosensitive polyamic acid to be used in the invention undergoes during exposure at the exposed area the conversion of the foregoing dihydropyridine derivative to a basic pyridine compound that accelerates the polyimidization of polyamic acid and hence reduces the speed of dissolution of the film in the developer and is itself converted to an insoluble cyclized compound and hence accelerates the polyimidization of polyamic acid during heating after exposure, resulting in the further reduction of solubility of the film in the developer at the exposed area as compared with at the unexposed area. Thus, since when the temperature of heating after exposure is as relatively high as about 170° C. or higher, the speed of dissolution of the film in the developer is remarkably smaller at the exposed area than at the unexposed area, the film which has been subjected to exposure, heating after exposure and development gives a negative image.

In accordance with the present invention, the foregoing photosensitive polyamic acid solution is applied to a metal foil substrate of continuous length, dried to form a polyamic acid film, irradiated with ultraviolet rays through a mask so that it is exposed in a predetermined pattern, heated, and then developed to form a negative image having a predetermined pattern which is then subjected to heat curing that causes imidization reaction resulting in the formation of an insulation layer comprising polyimide resin. In this manner, a circuit board of the invention can be obtained. Thus, in order to heat the polyamic acid so that it is polyimidized, it is preferred that the film of polyamic acid be heated to a temperature of from about 300° C. to 400° C. in vacuo or in an atmosphere of inert gas for several hours.

Thereafter, a predetermined circuit comprising a conductor layer having a predetermined pattern is formed on the insulation layer according to ordinary method. Required terminals are also formed on the circuit. Subsequently, the metal foil substrate of continuous length is chemically cut to a desired shape to obtain a wireless suspension board of the invention.

In accordance with the present invention, the foregoing aromatic diamine component may be partly replaced by an amino group-containing bifunctional polysiloxane as necessary to improve the adhesivity of the polyimide resin thus obtained to the substrate. A specific example of such an amino group-containing bifunctional polysiloxane is a polysiloxane represented by the following formula (IV):

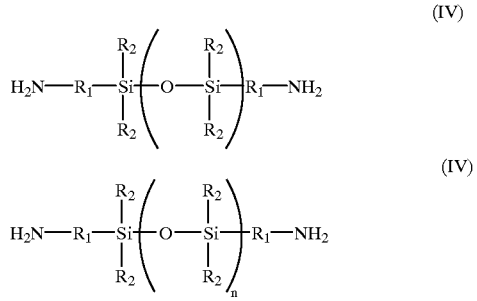

(IV)

(IV)

wherein $R^1$ represents a $C_{1-18}$ alkylene group; $R^2$ represents a $C_{1-18}$ alkyl group; and n represents an integer of from 1 to 100.

If the component comprising the foregoing aromatic diamine component and the foregoing amino group-containing bifunctional polysiloxane is a diamine component, the foregoing amino group-containing bifunctional polysiloxane is used in a proportion of 10 mol % or less of the diamine component.

Accordingly, in the present invention, the proportion (mol%) of the foregoing amino group-containing bifunctional polysiloxane is defined by the equation (e/(a+b+e))× 100 wherein a is the number of moles of the foregoing first aromatic diamine component, b is the number of moles of the foregoing second aromatic diamine component and e is the number of moles of the foregoing amino group-containing bifunctional polysiloxane.

Referring further to the foregoing formula (I), $R^1$ is preferably a $C_{1-7}$ alkylene group. Specific examples of $C_{1-7}$ alkylene group include alkylene groups such as methylene, ethylene, propylene, butylene and hexylene. $R^2$ is preferably a $C_{1-7}$ alkyl group. Specific examples of $C_{1-7}$ alkyl group include alkyl group such as methyl, ethyl, propyl, butyl and hexyl. The suffix n is preferably from 1 to 40. As the amino group-containing bifunctional polysiloxane there is preferably used bis(aminopropyl)tetramethyldisiloxane.

In accordance with the invention, the circuit board thus produced is then subjected to ordinary patterning method involving the formation of a pattern circuit comprising a conductor layer on the insulation layer comprising polyimide resin. Required terminals are also formed on the circuit board. The stainless steel foil is eventually chemically cut to a desired shape containing the foregoing insulation layer to obtain an individual wireless suspension board.

In accordance with the present invention, since the linear thermal expansion coefficient of polyimide resin is small as that of various metal foils, even a circuit board comprising an insulation layer comprising such a polyimide resin formed on a metal foil is not liable to cracking or peeling of the resin layer as well as warping of the resin layer. Accordingly, even a wireless suspension board comprising a pattern circuit comprising a conductor layer provided on such a circuit board is not liable to defective properties such as defective insulation.

Further, since the present invention allows precision patterning with a high sensitivity and a high contrast as previously mentioned, a wireless suspension board having a higher capacity and a smaller size can be provided.

The wireless suspension board according to the invention and its production will be further described in connection with the attached drawings.

FIG. 1 is a perspective view illustrating an embodiment of the wireless suspension board 1 according to the invention. The wireless suspension board 1 comprises an insulation layer (not shown) comprising a polyimide resin provided on a stainless steel foil substrate 2 and a predetermined pattern circuit comprising a copper conductor layer 3 formed thereon as a thin layer. The wireless suspension board 1 has a gimbal 4 formed by cutting integrally therewith at the tip thereof. A slider (not shown) having a magnetic head is fixed onto the gimbal 4. The wireless suspension board 1 also has required terminals 5 and 6 formed on the forward and rear ends thereof, respectively. In FIG. 1, the wireless suspension board 1 is shown free of a cover layer for covering and protecting the surface of the board.

FIG. 2 is a section view taken on the line A—A of FIG. 1. An insulation layer 7 comprising a polyimide resin is provided on a stainless steel foil substrate 2, and a predetermined pattern circuit comprising a copper conductor layer is formed as a thin layer on the insulation layer 7 with a thin chromium layer 23 interposed therebetween. This conductor layer is protected by a coat comprising a thin nickel layer 28. A terminal 5 is formed on the thin nickel layer 28. The laminate is entirely covered and protected by a coat layer 8 except the terminal.

FIG. 3 is a section view taken on the line B—B of FIG. 1. An insulation layer 7 comprising a polyimide resin is provided on a stainless steel foil substrate 2, and a predetermined pattern circuit comprising a copper conductor layer 3 is formed as a thin layer on the insulation layer 7 with a thin chromium layer 23 interposed therebetween. This conductor layer is protected by a coat comprising a thin nickel layer 28 which is in turn covered and protected by a coat layer 8.

As the stainless steel foil substrate 2 of continuous length there is normally used one having a thickness of from 10 μm to 60 μm, preferably from 15 μm to 30 μm from the standpoint of vibration properties, and a width of from 50 mm to 500 mm, preferably from 125 mm to 300 mm. However, the present invention is not limited to these sizes.

Figure 4:
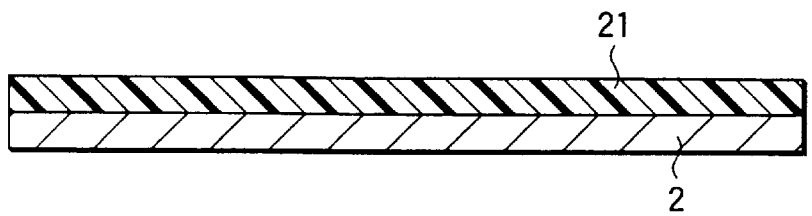
Figure 5:
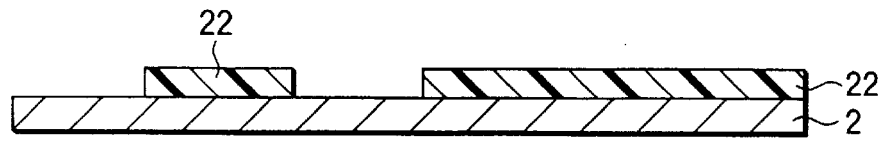

FIGS. 4 and 5 each illustrate a process for the production of a circuit board according to the invention. FIGS. 6 to 16 each illustrate a process for the production of a suspension with circuit according to the invention.

Firstly, as shown in FIG. 4, a photosensitive polyamic acid solution is applied to the entire surface of the foregoing stainless steel foil substrate 2 in such an amount that the resulting resin layer has a thickness of from 2 μm to 20 μm, preferably from 5 μm to 10 μm. The coated material is then heated to a temperature of from 60° C. to 150° C., preferably from 80° C. to 120° C. to form a coat layer 21 of the foregoing photosensitive polyamic acid.

Subsequently, the photosensitive polyamic acid coat layer is irradiated with ultraviolet rays through a proper mask so that it is exposed in a predetermined pattern. The integrated amount of exposing light is from 100 to 1,000 mJ/cm², preferably from 200 to 700 mJ/cm². The wavelength of exposing light is normally from 300 nm to 450 nm, preferably from 350 nm to 420 nm. After exposure, the coat layer is heated to a temperature of from 80° C. to 200° C., preferably 120° C. to 180° C. for about 2 to 10 minutes (heating after exposure), and then subjected to development. In the invention, a negative image is preferably obtained. Thereafter, the patterned coat layer of polyamic acid thus obtained is heat to a high temperature, and then subjected to polyimidation to form a patterned insulation layer 22 comprising a polyimide resin on the stainless steel foil substrate 2 as shown in FIG. 5. Thus, a circuit board according to the invention is obtained.

Figure 6:
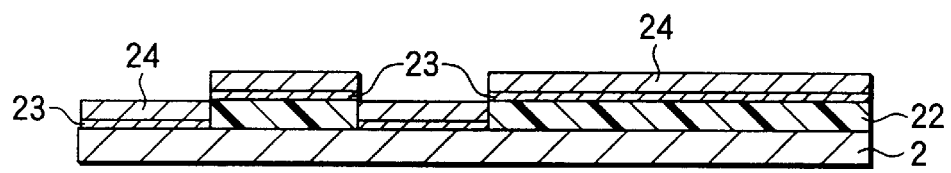

Subsequently, as shown in FIG. 6, a thin chromium layer 23 and a thin copper layer 24 are sequentially sputtered onto the entire surface of the stainless steel substrate 2 having a patterned insulation polyimide layer 22. The thin chromium layer 23 can be used to allow the thin copper layer 24 to come in close contact with the insulation layer 22 comprising polyimide. The thickness of the thin chromium layer and the thin copper layer are preferably from 100 to 600 Å and from 500 to 2,000 Å, respectively. The surface resistivity of the thin copper layer thus obtained is normally 0.6 Ω/□ or less.

Figure 7:
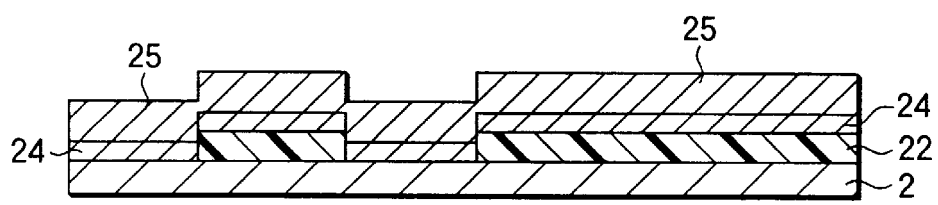

Thereafter, as shown in FIG. 7, the foregoing thin copper layer 24 is electroplated with copper to a thickness of from 2 μm to 15 μm to form a conductor layer 25 of copper. In FIG. 7, the foregoing thin chromium layer is not shown.

Figure 8:
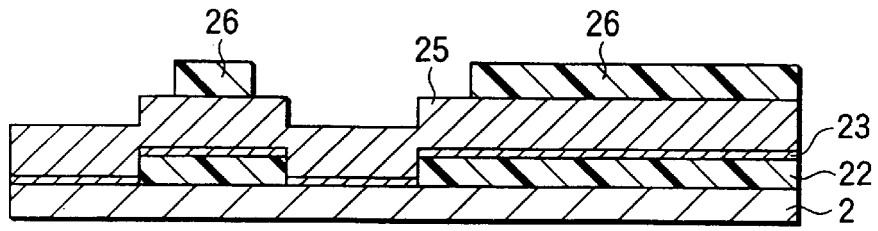
Figure 9:
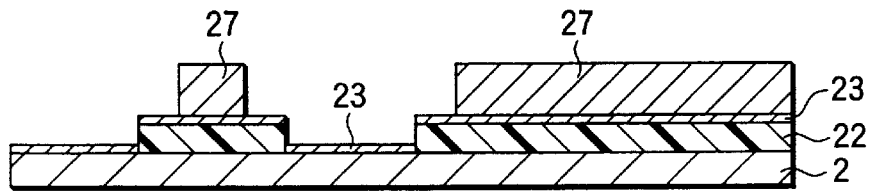
Figure 10:
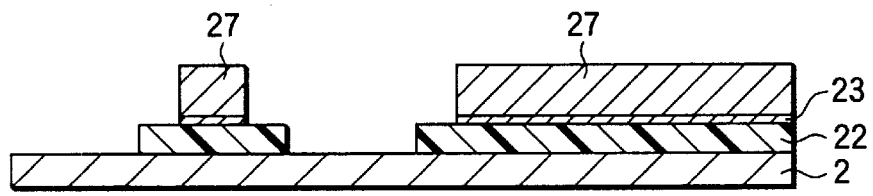

Subsequently, as shown in FIGS. 8 and 9, the laminate is subjected to exposure and development by an ordinary patterning technique using a liquid photoresist 26 or dry film laminate, and then subjected to etching to remove the copper conductor layer 25 at the non-pattern area. Thus, a predetermined pattern 27 of copper is formed on the foregoing insulation layer 22 comprising polyimide resin. The etching of copper is preferably effected by alkali etching.

The etching of the copper conductor layer at the non-pattern area is followed by the etching of the foregoing thin chromium layer 23 to form a predetermined pattern 27 on the foregoing insulation layer 22 comprising polyimide resin. For the etching of the thin chromium layer 23, a potassium ferricyanate-based etching solution may be used. Further, a potassium permanganate-based etching solution, a sodium metasilicate-based etching solution, etc. may be used.

After the removal of undesirable thin chromium layer from the substrate, electroless nickel plating is effected to form a thin hard nickel layer 28 on the foregoing copper conductor layer 27 and stainless steel foil substrate 2 so that the surface of the copper conductor layer is covered and protected. Accordingly, the thickness of the nickel deposit may be such that the underlying copper conductor layer is not exposed. It is normally from 0.05 μm to 0.1 μm.

Figure 12:
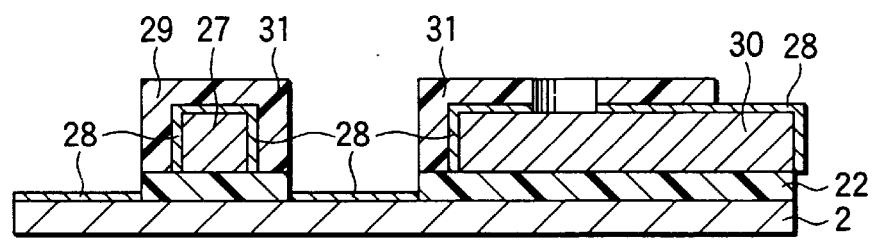

Thereafter, the conductor pattern 27 on the wiring area is covered and protected by the foregoing photosensitive polyamic acid. Terminals are also formed at the required terminal portions. The laminate is then covered and protected except the terminals to form a cover layer. In FIG. 12 and after, the formation of wiring portion and terminal portion are shown left and right of the substrate, respectively.

As shown in FIG. 12, at the wiring portion, a conductor pattern 27 is coated with a polyimide resin 29. At the terminal portion, patterning is effected such that the terminal portion is left and a lead portion 30 at which terminals are formed by electroplating is left. The terminal portion is then coated with the foregoing photosensitive polyamic acid, exposed to light, heated, developed, and then heat-cured (imidation) in the same manner as mentioned above, and then coated with a polyimide resin to form a coat layer 31.

Figure 11:
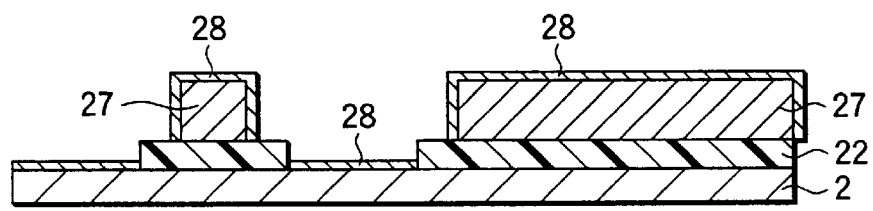
Figure 13:
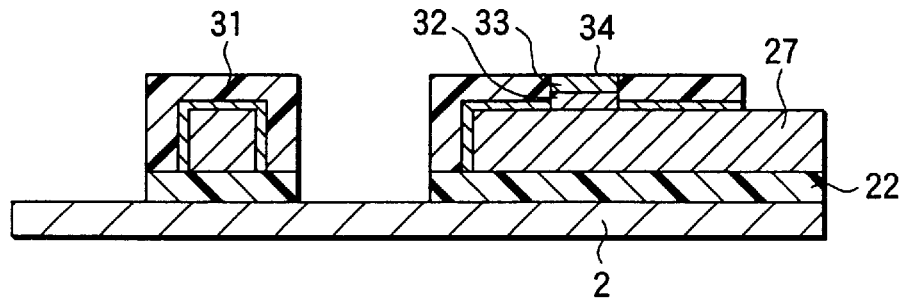

Subsequently, as shown in FIG. 13, at the terminal portion, the electrolessly deposited thin nickel layer 28 which had protected the surface of the conductor pattern 27 is peeled (see FIG. 11). At the same time, the electrolessly deposited thin nickel layer 28 on the stainless steel foil substrate 2 is removed. Thereafter, the stainless steel foil substrate, the conductor pattern 27 and the polyimide resin coat layer 31 are coated with a resist except the terminal portion using an ordinary method with an ordinary photoresist. The foregoing terminal portion is then sequentially electroplated with nickel (reference numeral 32) and gold (reference numeral 33) to form a terminal 34. The thickness of the electrolytically deposited nickel and gold are each preferably from 1 μm to 5 μm. Thereafter, the foregoing resist is removed.

Figure 14:
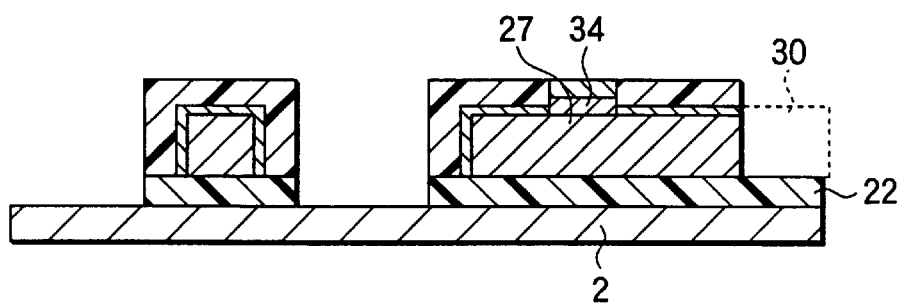

Subsequently, as shown in FIG. 14, the conductor pattern 27 on which the terminal 34 has been formed is subjected to chemical etching so that the lead portion 30 (see FIG. 12) which has been used in electroplating is removed. The removal of copper and chromium at the lead portion can be accomplished by the same method as mentioned above.

Figure 15:
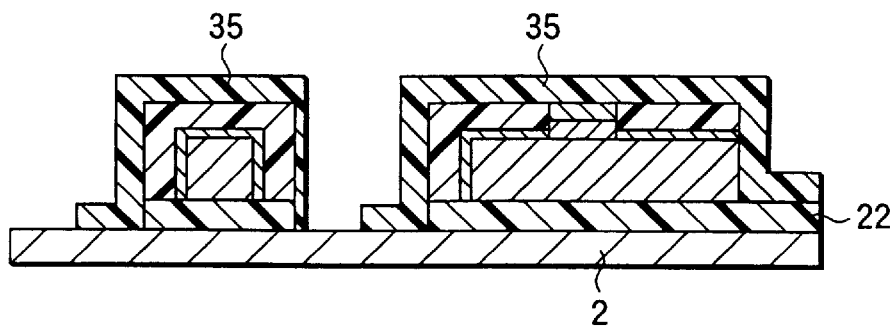

In order to cut the stainless steel foil substrate 2 from which the lead portion has been removed into a desired shape by chemical etching, the laminate is then subjected to exposure and development using a photoresist 35 and a dry film laminate to form a desired pattern on the stainless steel foil substrate 2 as shown in FIG. 15. The stainless steel foil substrate is then etched so that it is cut into a desired shape. As the etching solution to be used herein there may be used an aqueous solution of ferric chloride, cuprous chloride or the like.

Figure 16:
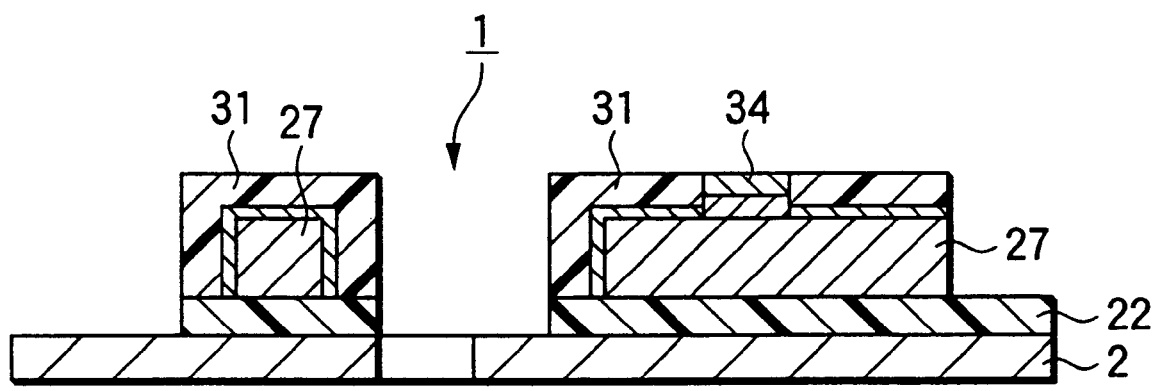

The laminate which has been thus subjected to etching is washed with purified water, and then dried to obtain a suspension board 1 with circuit according to the invention as shown in FIG. 16. In some detail, the wireless suspension board comprises an insulation layer 22 comprising polyimide resin provided on a stainless steel foil substrate 2. A conductor pattern 27 comprising a thin conductor layer, i.e., pattern circuit is provided on the insulation layer 22. The laminate is entirely covered and protected by a coat layer 31 comprising polyimide resin except the terminal 34.

The polyimide resin according to the invention comprises as a carboxylic acid component pyromellitic anhydride and 2,2-bis(3,4-dicarboxyphenyl)hexafluoropropane at a predetermined ratio and as an aromatic diamine component the foregoing first aromatic diamine, i.e., foregoing 2,2'-di-substituted diaminobiphenyl, and the second aromatic diamine, i.e., any of the foregoing 2,2-bis(4-aminophenoxyphenyl)propanes, 1,1-bis(4-(4-aminophenoxy)-3-t-butyl-6-methylphenyl)butane, 2,2-bis(3-amono-4-methylphenyl)hexafluoropropane and α,α'-bis(4-aminophenyl) diisopropylbenzenes, and has a low linear thermal expansion coefficient and a low dielectric constant. The circuit board according to the invention comprises an insulation layer comprising such a polyimide resin provided on a metal foil substrate. Since the linear thermal expansion coefficient of the polyimide resin is small as that of the metal foil, the resulting circuit board is not liable to cracking or peeling of the resin layer as well as warping of the resin layer. Accordingly, the wireless suspension board according to the invention is not liable to cracking or peeling of the resin layer as well as warping of the resin layer and hence defective properties.

In addition, the circuit board and wireless suspension board according to the invention can be preferably used in the production of various electronic parts allowing faster processing of signal because the polyimide resin contained therein has a low linear expansion coefficient as well as a low dielectric constant.

The present invention will be further described in the following examples, but the present invention should not be construed as being limited thereto. The measuring instrument used in the examples and comparative examples are as follows.

- Linear expansion coefficient: Type TMA/SS100 thermal mechanical analyzer produced by SEIKO INSTRUMENT INC.
- Dielectric constant: Type HP 16451B dielectric measuring instrument produced by Yokokawa Hewlett Packard Co., Ltd.
- Rotational viscosity: Type B viscometer produced by Tokyo Keiki Kogyo K.K.
- GPC (gel permeation chromatography) apparatus: HLC8020 produced by TOSOH CORP. (column: $GMH_{XL}+GMH_{XL}-+G2500H_{XL}$)

EXAMPLE 1

Into a 500 ml four neck flask equipped with a stirrer were charged 18.7 g (88.0 mmol) of 2,2'-dimethyl-4,4'- diaminobiphenyl, 9.0 g (22.0 mmol) of 2,2-bis(4-aminophenoxyphenyl)propane and 227 g of N-methyl-2-pyrrolidone. The mixture was then stirred at room temperature to obtain a solution. To the solution thus obtained were then added 19.2 g (88.0 mmol) of pyromellitic anhydride and 9.8 g (22.0 mmol) of 2,2-bis(3,4-dicarboxyphenyl) hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution. The polyamic acid solution thus obtained exhibited a rotational viscosity of 300 poise. The polyamic acid was measured for molecular weight by GPC method. As a result, the polyamic acid was found to have a number-average molecular weight of 13,000 and a weight-average molecular weight of 36,000.

The foregoing polyamic acid solution was casted onto a glass plate, and then heated from room temperature to 360° C. in 2 hours and then at the same temperature for 2 hours in vacuo to obtain a polyimide resin film. The polyimide resin film thus obtained had a linear thermal expansion coefficient of 18 ppm and a dielectric constant of 3.20.

The foregoing polyamic acid solution was casted onto the surface of a stainless steel (SUS304) foil having a linear thermal expansion coefficient of 17 ppm, and then heated from room temperature to 360° C. in 2 hours and then at the same temperature for 2 hours so that it underwent ring closure and imidation to obtain a polyimide resin film. Thereafter, when the temperature of the polyimide resin film was returned to room temperature, the stainless steel foil was not warped. This will be hereinafter referred to as "polyamic acid film-forming test".

EXAMPLE 2

Into a 500 ml four neck flask equipped with a stirrer were charged 18.7 g (88.0 mmol) of 2,2'-dimethyl-4,4'-diaminobiphenyl, 11.4 g (22.0 mmol) of 2,2-bis(4-aminophenoxyphenyl)hexafluoropropane and 236 g of N-methyl-2-pyrrolidone. The mixture was then stirred at room temperature to obtain a solution. To the solution thus obtained were then added 19.2 g (88.0 mmol) of pyromellitic anhydride and 9.8 g (22.0 mmol) of 2,2-bis(3,4-dicarboxyphenyl)hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution. The polyamic acid solution thus obtained exhibited a rotational viscosity of 260 poise. The polyamic acid was measured for molecular weight. As a result, the polyamic acid was found to have a number-average molecular weight of 13,000 and a weight-average molecular weight of 36,000.

The foregoing polyamic acid solution was casted onto a glass plate, and then subjected to the same treatment as in Example 1 to obtain a polyimide resin film. The polyimide resin film thus obtained had a linear thermal expansion coefficient of 22 ppm and a dielectric constant of 3.17.

When subjected to the foregoing polyamic acid film-forming test, the stainless steel foil was not warped.

EXAMPLE 3

Into a 500 ml four neck flask equipped with a stirrer were charged 28.2 g (88.0 mmol) of 2,2'-di(trifluoromethyl)-4,4'-diaminobiphenyl, 12.4 g (22.0 mmol) of 1,1-bis(4-aminophenoxy)-3-t-butyl-6-methylphenyl)butane and 278 g of N-methyl-2-pyrrolidone. The mixture was then stirred at room temperature to obtain a solution. To the solution thus obtained were then added 19.2 g (88.0 mmol) of pyromellitic anhydride and 9.8 g (22.0 mmol) of 2,2-bis(3,4-dicarboxyphenyl) hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution. The polyamic acid solution thus obtained exhibited a rotational viscosity of 240 poise. The polyamic acid was measured for molecular weight by GPC method. As a result, the polyamic acid was found to have a number-average molecular weight of 19,000 and a weight-average molecular weight of 48,000.

The foregoing polyamic acid solution was casted onto a glass plate, and then subjected to the same treatment as in Example 1 to obtain a polyimide resin film. The polyimide resin film thus obtained had a linear thermal expansion coefficient of 17 ppm and a dielectric constant of 2.88.

When subjected to the foregoing polyamic acid film-forming test, the stainless steel foil was not warped.

EXAMPLE 4

Into a 500 ml four neck flask equipped with a stirrer were charged 18.7 g (88.0 mmol) of 2,2'-dimethyl-4,4'-diaminobiphenyl, 12.4 g (22.0 mmol) of 1,1-bis(4-aminophenoxy)-3-t-butyl-6-methylphenyl)butane and 240 g of N-methyl-2-pyrrolidone. The mixture was then stirred at room temperature to obtain a solution. To the solution thus obtained were then added 19.2 g (88.0 mmol) of pyromellitic anhydride and 9.8 g (22.0 mmol) of 2,2-bis(3,4-dicarboxyphenyl)hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution. The polyamic acid solution thus obtained exhibited a rotational viscosity of 420 poise. The polyamic acid was measured for molecular weight by GPC method. As a result, the polyamic acid was found to have a number-average molecular weight of 18,000 and a weight-average molecular weight of 47,000.

The foregoing polyamic acid solution was casted onto a glass plate, and then subjected to the same treatment as in Example 1 to obtain a polyimide resin film. The polyimide resin film thus obtained had a linear thermal expansion coefficient of 20 ppm and a dielectric constant of 2.95.

When subjected to the foregoing polyamic acid film-forming test, the stainless steel foil was not warped.

EXAMPLE 5

Into a 500 ml four neck flask equipped with a stirrer were charged 13.6 g (64.0 mmol) of 2,2'-dimethyl-4,4'-diaminobiphenyl and 5.8 g (16.0 mmol) of 2,2-bis(3-amino-4-methylphenyl)hexafluoropropane with 162 g of N-methyl-2-pyrrolidone. The mixture was then stirred at room temperature to obtain a solution. To the solution thus obtained were then added 14.0 g (64.0 mmol) of pyromellitic anhydride and 7.11 g (16.0 mmol) of 2,2-bis(3,4-dicarboxyphenyl) hexafluoropropane. The mixture was then stirred at room temperature for 6 hours, and then stirred at a temperature of 50° C. for 17 hours. Heating was then suspended. The solution was then allowed to cool to room temperature to obtain a polyamic acid solution. The polyamic acid solution thus obtained exhibited a rotational viscosity of 17.4 Pa·s. The polyamic acid was measured for molecular weight by GPC method. As a result, the polyamic acid was found to have a number-average molecular weight of 13,400 and a weight-average molecular weight of 35,000.

The foregoing polyamic acid solution was casted onto a glass plate, and then subjected to the same treatment as in Example 1 to obtain a polyimide resin film. The polyimide resin film thus obtained had a linear thermal expansion coefficient of 21 ppm and a dielectric constant of 2.94.

When subjected to the foregoing polyamic acid film-forming test, the stainless steel foil was not warped.

EXAMPLE 6

Into a 500 ml four neck flask equipped with a stirrer were charged 13.6 g (64.0 mmol) of 2,2'-dimethyl-4,4'-diaminobiphenyl and 5.51 g (16.0 mmol) of α,α'-bis(4-aminophenyl)-1,4-diisopropylbenzene with 227 g of N-methyl-2-pyrrolidone. The mixture was then stirred at room temperature to obtain a solution. To the solution thus obtained were then added 14.0 g (64.0 mmol) of pyromellitic anhydride and 7.11 g (16.0 mmol) of 2,2-bis(3,4-dicarboxyphenyl) hexafluoropropane. The mixture was then stirred at room temperature for 6 hours, and then stirred at a temperature of 50° C. for 17 hours. Heating was then suspended. The solution was then allowed to cool to room temperature to obtain a polyamic acid solution. The polyamic acid solution thus obtained exhibited a rotational viscosity of 8.6 Pa·s. The polyamic acid was measured for molecular weight by GPC method. As a result, the polyamic acid was found to have a number-average molecular weight of 6,600 and a weight-average molecular weight of 21,900.

The foregoing polyamic acid solution was casted onto a glass plate, and then subjected to the same treatment as in Example 1 to obtain a polyimide resin film. The polyimide resin film thus obtained had a linear thermal expansion coefficient of 18 ppm and a dielectric constant of 2.97.

When subjected to the foregoing polyamic acid film-forming test, the stainless steel foil was not warped.

EXAMPLE 7

Into a 500 ml four neck flask equipped with a stirrer were charged 13.6 g (64.0 mmol) of 2,2'-dimethyl-4,4'-diaminobiphenyl and 5.51 g (16.0 mmol) of α,α'-bis(4-aminophenyl)-1,4-diisopropylbenzene with 161 g of N-methyl-2-pyrrolidone. The mixture was then stirred at room temperature to obtain a solution. To the solution thus obtained were then added 14.0 g (64.0 mmol) of pyromellitic anhydride and 7.11 g (16.0 mmol) of 2,2-bis(3,4-dicarboxyphenyl) hexafluoropropane. The mixture was then stirred at room temperature for 6 hours, and then stirred at a temperature of 50° C. for 17 hours. Heating was then suspended. The solution was then allowed to cool to room temperature to obtain a polyamic acid solution. The polyamic acid solution thus obtained exhibited a rotational viscosity of 8.2 Pa·s. The polyamic acid was measured for molecular weight. As a result, the polyamic acid was found to have a number-average molecular weight of 7,300 and a weight-average molecular weight of 23,400.

The foregoing polyamic acid solution was casted onto a glass plate, and then subjected to the same treatment as in Example 1 to obtain a polyimide resin film. The polyimide resin film thus obtained had a linear thermal expansion coefficient of 20 ppm and a dielectric constant of 2.94.

When subjected to the foregoing polyamic acid film-forming test, the stainless steel foil was not warped.

COMPARATIVE EXAMPLE 1

Into a 500 ml four neck flask equipped with a stirrer were charged 51.8 g (100 mmol) of 2,2-bis(4-aminophenoxyphenyl)hexafluoropropane and 385 g of N-methyl-2-pyrrolidone. The mixture was then stirred at room temperature to obtain a solution. To the solution thus obtained were then added 44.4 g (100 mmol) of 2,2-bis(3,4-dicarboxyphenyl)hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution.

The foregoing polyamic acid solution was casted onto a glass plate, and then subjected to the same treatment as in Example 1 to obtain a polyimide resin film. The polyimide resin film thus obtained had a linear thermal expansion coefficient of 75 ppm and a dielectric constant of 2.77.

When subjected to the foregoing polyamic acid film-forming test, the stainless steel foil was warped.

COMPARATIVE EXAMPLE 2

Into a 500 ml four neck flask equipped with a stirrer were charged 56.5 g (100 mmol) of 1,1-bis(4-(4-aminophenoxy)-3-t-butyl-6-methylphenyl)butane and 385 g of N-methyl-2-pyrrolidone. The mixture was then stirred at room temperature to obtain a solution. To the solution thus obtained were then added 44.4 g (100 mmol) of 2,2-bis(3,4-dicarboxyphenyl)hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution.

The foregoing polyamic acid solution was casted onto a glass plate, and then subjected to the same treatment as in Example 1 to obtain a polyimide resin film. The polyimide resin film thus obtained had a linear thermal expansion coefficient of 54 ppm and a dielectric constant of 2.57.

When subjected to the foregoing polyamic acid film-forming test, the stainless steel foil was warped.

COMPARATIVE EXAMPLE 3

Into a 500 ml four neck flask equipped with a stirrer were charged 36.23 g (100 mmol) of 2,2-bis(3-amino-4-methylphenyl)hexafluoropropane and 385 g of N-methyl-2-pyrrolidone. The mixture was then stirred at room temperature to obtain a solution. To the solution thus obtained were then added 44.4 g (100 mmol) of 2,2-bis(3,4-dicarboxyphenyl)hexafluoropropane. The mixture was then stirred at room temperature for 20 hours to obtain a polyamic acid solution.

The foregoing polyamic acid solution was casted onto a glass plate, and then subjected to the same treatment as in Example 1 to obtain a polyimide resin film. The polyimide resin film thus obtained had a linear thermal expansion coefficient of 57 ppm and a dielectric constant of 2.5.

When subjected to the foregoing polyamic acid film-forming test, the stainless steel foil was warped.

EXAMPLE 8

To the polyamic acid solution obtained in Example 1 were added 17.0 g (49.1 mmol) of nifedipine, 11.3 g (36.1 mmol) of an acetyl form and 2.44 g (35.8 mmol) of imidazole to prepare a photosensitive polyamic acid solution.

The photosensitive polyamic acid solution thus prepared was applied longitudinally to a stainless steel (SUS) foil having a thickness of 25 μm by means of a continuous coater, and then dried at a temperature of 120° C. for 2 minutes to form a photosensitive polyamic acid coat layer. Subsequently, the photosensitive polyamic acid coat layer thus formed was irradiated with ultraviolet rays at an exposure of 700 mJ/cm$^2$ through a mask, heated to a temperature of 160° C. for 3 minutes, developed to form a negative image, and then heated to a temperature of 400° C. at a pressure of 0.01 torr to form an insulation layer (thickness: 6 μm) comprising a patterned polyimide resin film. Thus, a circuit board was obtained.

The polyimide resin film thus obtained exhibited a linear thermal expansion coefficient of 18 ppm and a dielectric constant of 3.20. The foregoing SUS304 stainless steel foil exhibited a linear thermal expansion coefficient of 17 ppm.

For the measurement of linear thermal expansion coefficient, a specimen having a width of 2 mm, a thickness of 6 μm and a length of 30 mm was subjected to TMA testing method (thermal mechanical analysis). In this testing method, the temperature rising rate was 10° C./min, and the load was 5 g.

Subsequently, the insulation layer comprising polyimide on the circuit board was subjected to continuous sputtering to form a thin chromium layer and a thin copper layer to a thickness of 500 Å and 1,000 Å, respectively. The surface resistivity of the thin copper layer was from 0.3 to 0.4 Ω/□.

Subsequently, a slightly adhesive sheet was applied to the other side of the stainless steel substrate as a mask. The thin copper layer was entirely electroplated with copper sulfate to form a conductor layer comprising copper deposit having a thickness of 10 μm.

Thereafter, a commercially available dry film laminate was laminated on the conductor layer at 110° C. according to an ordinary method. The laminate was exposed at an exposure of 80 mJ/cm$^2$, developed, etched with an alkali on the copper conductor layer at the non-pattern area in a pattern such that a wiring portion, a terminal portion and a lead portion for electroplating were left behind, and then freed of resist. Subsequently, the stainless steel foil thus treated was dipped in an aqueous solution of a mixture of potassium ferricyanate and sodium hydroxide at 25° C. to remove undesirable thin chromium layer.

Thereafter, the stainless steel substrate was subjected to ordinary electroless plating to form a thin nickel layer on the entire surface of the stainless steel foil having a conductor layer and an insulation layer to a thickness of about 0.5 μm. Subsequently, as previously mentioned, a desired coat layer of photosensitive polyamic acid was formed on the wiring portion and terminal portion on the stainless steel foil in the same manner as mentioned above. Subsequently, the substrate was dipped in a nitric acid-based peeling agent to remove the foregoing electrolessly deposited thin film from the terminal portion and stainless steel foil.

Thereafter, the laminate was coated with an ordinary photoresist except that the foregoing terminal portion. Subsequently, the foregoing terminal portion was sequentially subjected to electroplating with nickel and gold to a thickness of 1 μm for each to form a terminal. Thereafter, the foregoing resist was peeled. The plating process was followed by the etching of copper with an alkali and the etching of chromium in the same manner as previously mentioned for the purpose of removing the lead portion used for plating from the conductor layer.

Thus, the plating lead portion was removed from the conductor layer. In order to cut the stainless steel foil substrate into a desired shape, the laminate was subjected to exposure and development using a photoresist or dry film laminate according to an ordinary method to form a desired pattern on the stainless steel foil. The stainless steel foil substrate was then dipped in a ferric chloride etching solution at 45° C. so that it was cut into a desired shape. The laminate thus cut was thoroughly washed with purified water, and then dried to obtain individually cut suspension boards with circuit.

The wireless suspension board thus obtained underwent no cracking of the resin layer nor the peeling of the resin layer from the substrate because the polyimide resin has a small linear thermal expansion coefficient. Further, since the wireless suspension board has a high reliability and undergoes no warping, it showed no defective properties.

EXAMPLE 9

To the polyamic acid solution obtained in Example 2 were added 17.7 g (51.2 mmol) of nifedipine, 11.8 g (37.6 mmol) of an acetyl form and 2.54 g (37.3 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 22 ppm and a dielectric constant of 3.17.

Subsequently, the foregoing circuit board was treated in the same manner as in Example 8 to obtain a wireless suspension board having a high performance as in Example 8.

EXAMPLE 10

Into a 500 ml four neck flask equipped with a stirrer were charged 16.4 g (77.0 mmol) of 2,2'-dimethyl-4,4'-diaminobiphenyl, 11.4 g (22.0 mmol) of 2,2-bis(4-aminophenoxyphenyl)hexafluoropropane, 2.70 g (11.0 mmol) of bis(aminopropyl)tetramethyldisiloxane and 236 g of N-methyl-2-pyrrolidone. The mixture was then stirred at room temperature to obtain a solution. To the solution thus obtained were then added 19.2 g (88.0 mmol) of pyromellitic anhydride and 9.8 g (22.0 mmol) of 2,2-bis(3,4-dicarboxyphenyl) hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution. The polyamic acid solution thus obtained exhibited a rotational viscosity of 260 poise. The polyamic acid was measured for molecular weight. As a result, the polyamic acid was found to have a number-average molecular weight of 13,000 and a weight-average molecular weight of 36,000.

Subsequently, to the foregoing polyamic acid solution were added 17.7 g (51.2 mmol) of nifedipine, 11.8 g (37.6 mmol) of an acetyl form and 2.54 g (37.3 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 23 ppm and a dielectric constant of 3.15.

Subsequently, the foregoing circuit board was treated in the same manner as in Example 8 to obtain a wireless suspension board having a high performance as in Example 8.

EXAMPLE 11

To the polyamic acid solution obtained in Example 3 were added 20.9 g (60.3 mmol) of nifedipine, 13.9 g (44.3 mmol) of an acetyl form and 2.99 g (44.0 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 17 ppm and a dielectric constant of 2.88.

Subsequently, the foregoing circuit board was treated in the same manner as in Example 8 to obtain a wireless suspension board having a high performance as in Example 8.

EXAMPLE 12

To the polyamic acid solution obtained in Example 4 were added 18.0 g (52.1 mmol) of nifedipine, 12.0 g (38.2 mmol) of an acetyl form and 2.58 g (38.0 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 20 ppm and a dielectric constant of 2.95.

Subsequently, the foregoing circuit board was treated in the same manner as in Example 8 to obtain a wireless suspension board having a high performance as in Example 8.

EXAMPLE 13

Into a 500 ml four neck flask equipped with a stirrer were charged 16.4 g (77.0 mmol) of 2,2'-dimethyl-4,4'-diaminobiphenyl, 12.4 g (22.0 mmol) of 1,1-bis(4-(4-aminophenoxy)-3-t-butyl-6-methylphenyl)butane, 2.70 g (11.0 mmol) of bis(aminopropyl)tetramethyldisiloxane and 240 g of N-methyl-2-pyrrolidone. The mixture was then stirred at room temperature to obtain a solution. To the solution thus obtained were then added 19.2 g (88.0 mmol) of pyromellitic anhydride and 9.8 g (22.0 mmol) of 2,2-bis(3,4-dicarboxyphenyl)hexafluoropropane. The mixture was then stirred at room temperature for 1 hour, and then stirred at a temperature of 50° C. for 18 hours. Heating was then suspended. The solution was then allowed to cool to room temperature to obtain a polyamic acid solution. The polyamic acid solution thus obtained exhibited a rotational viscosity of 420 poise. The polyamic acid was measured for molecular weight. As a result, the polyamic acid was found to have a number-average molecular weight of 18,000 and a weight-average molecular weight of 47,000.

Subsequently, to the foregoing polyamic acid solution were added 18.0 g (52.1 mmol) of nifedipine, 12.0 g (38.2 mmol) of an acetyl form and 2.58 g (38.0 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 21 ppm and a dielectric constant of 3.00.

Subsequently, the foregoing circuit board was treated in the same manner as in Example 8 to obtain a wireless suspension board having a high performance as in Example 8.

EXAMPLE 14

To the polyamic acid solution obtained in Example 5 were added 12.12 g (35.0 mmol) of nifedipine, 8.08 g (25.7 mmol) of an acetyl form and 1.75 g (25.0 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 21 ppm and a dielectric constant of 2.94.

Subsequently, the foregoing circuit board was treated in the same manner as in Example 8 to obtain a wireless suspension board having a high performance as in Example 8.

EXAMPLE 15

To the polyamic acid solution obtained in Example 6 were added 12.1 g (34.8 mmol) of nifedipine, 8.04 g (25.6 mmol) of an acetyl form and 1.73 g (25.4 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 18 ppm and a dielectric constant of 2.97.

Subsequently, the foregoing circuit board was treated in the same manner as in Example 8 to obtain a wireless suspension board having a high performance as in Example 8.

EXAMPLE 16

To the polyamic acid solution obtained in Example 5 were added 12.1 g (34.8 mmol) of nifedipine, 8.04 g (25.6 mmol) of an acetyl form and 1.73 g (25.4 mmol) of imidazole to prepare a photosensitive polyamic acid solution.

In the same manner as in Example 8, the foregoing photosensitive polyamic acid was applied to a stainless steel (SUS304) foil having a thickness of 25 μm, heated and dried to form a coat layer of photosensitive polyamic acid, and then subjected to patterning to form a patterned insulation layer (thickness: 6 μm) comprising polyimide resin. Thus, a circuit board was obtained.

As a result of measurement in the same manner as in Example 8, the foregoing polyimide resin film was found to have a linear thermal expansion coefficient of 20 ppm and a dielectric constant of 2.94.

Subsequently, the foregoing circuit board was treated in the same manner as in Example 8 to obtain a wireless suspension board having a high performance as in Example 8.

The entire disclosure of each and every foreign patent application from which the benefit of foreign priority has been claimed in the present application is incorporated herein by reference, as if fully set forth.

We claim:

1. A polyamic acid having a weight-average molecular weight of from 20,000 to 100,000, which comprises a repeating unit represented by the following formula (I):

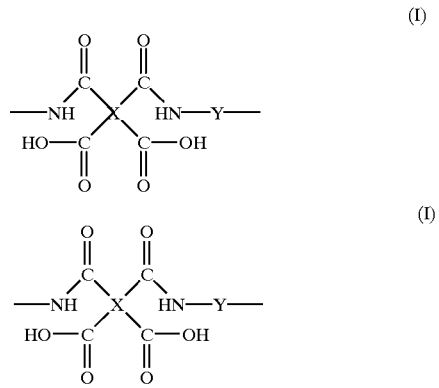

wherein X represents a tetravalent organic group represented by the following formula (a) or (b):

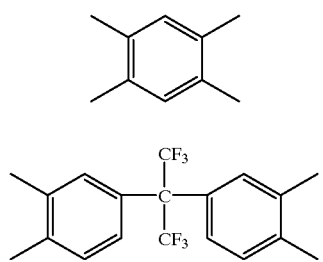

and Y represents a divalent organic group represented by the following formula (c) or (e):

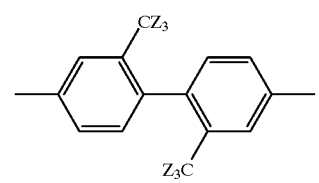

in which Z represents a hydrogen atom or a fluorine atom,

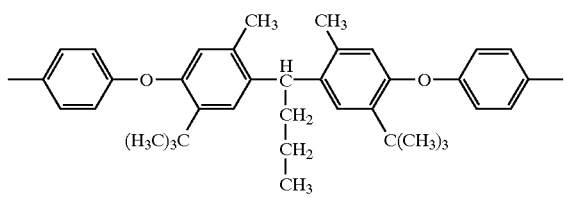

wherein the organic group represented by the formula (a) and the organic group represented by the formula (b) account for from 20 to 99 mol % and from 1 to 80 mol % of the organic groups represented by X, respectively, and the organic group represented by the formula (c) and the organic group represented by the formula (e) account for from 20 to 99 mol % and from 1 to 80 mol % of the organic groups represented by Y, respectively.

2. A polyimide resin having a weight-average molecular weight of from 20,000 to 100,000, which comprises a repeating unit represented by the following formula (II):

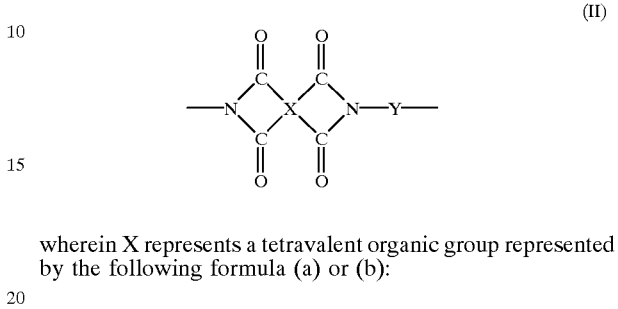

wherein X represents a tetravalent organic group represented by the following formula (a) or (b):

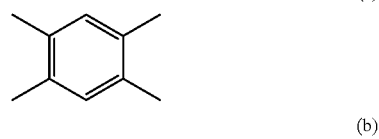

and Y represents a divalent organic group represented by the following formula (c) or (e):

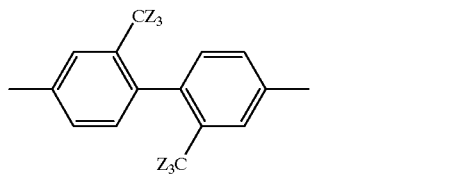

in which Z represents a hydrogen atom or a fluorine atom,

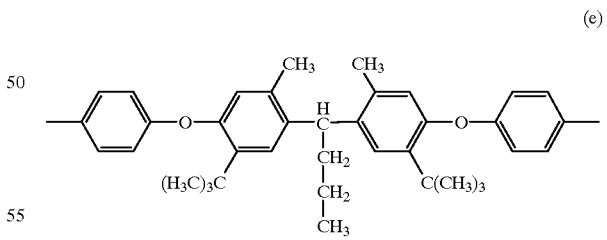

wherein the organic group represented by the formula (a) and the organic group represented by the formula (b) account for from 20 to 99 mol % and from 1 to 80 mol % of the organic groups represented by X, respectively, and the organic group represented by the formula (c) and the organic group represented by the formula account for from 20 to 99 mol % and from 1 to 80 mol % of the organic groups represented by Y, respectively.

3. The polyimide resin as claimed in claim 2, which has a linear thermal expansion coefficient of 5 to 30 ppm, and a dielectric constant of 2.8 to 3.2.

4. A circuit board comprising a metal foil substrate, and an insulation layer comprising a polyimide resin provided on the metal foil substrate, wherein the polyimide resin is a polyimide resin as claimed in claim 2.

5. A wireless suspension board comprising a metal foil substrate, an insulation layer comprising a polyimide resin provided on the metal foil substrate, and a pattern circuit comprising a conductor layer provided on the insulating layer, wherein the polyimide resin is a polyimide resin as claimed in claim 2.

* * * * *